United States Patent [19]

Senda et al.

[11] Patent Number: 5,703,685
[45] Date of Patent: Dec. 30, 1997

[54] ALIGNMENT METHOD

[75] Inventors: Shinya Senda, Kawasaki; Hiroshi Haraguchi, Tokyo, both of Japan

[73] Assignee: Kabushiki Kaisha Toshiba, Kawasaki, Japan

[21] Appl. No.: 508,879

[22] Filed: Jul. 20, 1995

Related U.S. Application Data

[63] Continuation of Ser. No. 181,462, Jan. 14, 1994, abandoned.

[30] Foreign Application Priority Data

Mar. 5, 1993 [JP] Japan ............................ 5-045088

[51] Int. Cl.$^6$ ............................................ G01B 11/00
[52] U.S. Cl. ............................................... 356/401
[58] Field of Search .......................... 356/375, 399–401, 356/356; 348/93, 94, 95

[56] References Cited

U.S. PATENT DOCUMENTS

| | | | |
|---|---|---|---|
| 3,555,172 | 1/1971 | Heinz | 348/95 |
| 4,669,884 | 6/1987 | Bigelow et al. | 356/401 |
| 4,702,606 | 10/1987 | Matsuura et al. | 356/401 |
| 4,744,663 | 5/1988 | Hamashima et al. | 356/375 |
| 5,094,539 | 3/1992 | Komoriya et al. | 356/401 |
| 5,120,974 | 6/1992 | Muraki | 356/401 |
| 5,229,617 | 7/1993 | Saitoh et al. | 356/401 |
| 5,438,413 | 8/1995 | Mazor et al. | 356/401 |

FOREIGN PATENT DOCUMENTS

405087530  4/1993  Japan ............................ 356/356

*Primary Examiner*—K. Hantis
*Attorney, Agent, or Firm*—Finnegan, Henderson, Farabow, Garrett & Dunner, L.L.P.

[57] ABSTRACT

An alignment method is provided for determining a mark position by using any of a first method for determining a mark position with one of photodiodes for colors which shows a maximal contrast between a mark area and a non-mark area, a second method for determining a mark position by detecting mark positions with photodiodes for colors and taking an average for these positions and a third method for determining a mark position by determining a ratio for determining that mark position, through the photodiodes for colors, by using different contrast levels between a mark area and a non-mark area and a CCD color area sensor.

19 Claims, 11 Drawing Sheets

ALIGNMENT METHOD

This application is a continuation of application Ser. No. 08/181,462, filed Jan. 14, 1994, now abandoned.

BACKGROUND OF THE INVENTION

1. Field of the Invention

The present invention relates to a method for making alignment as used when, for example, a semiconductor device is to be manufactured.

2. Description of the Related Art

When, in general, a semiconductor device is to be manufactured, alignment is made, through an exposure device, on a wafer at an alignment mark. In this connection, two conventional alignment methods will be explained below by way of example.

Figure 1:
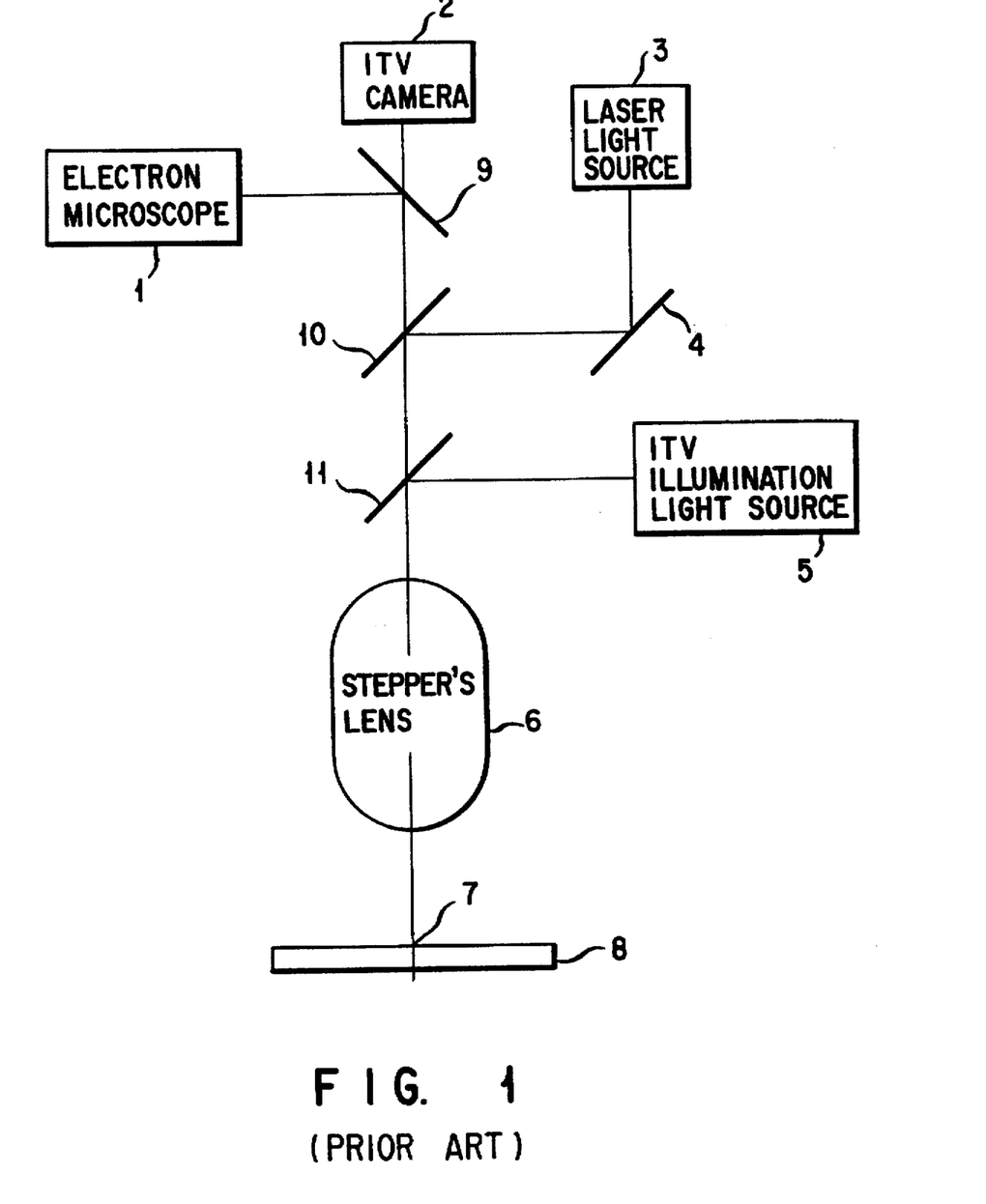
FIG. 1 is a diagrammatic view showing an optical system as employed by an alignment method according to a first conventional example.
Figure 2:
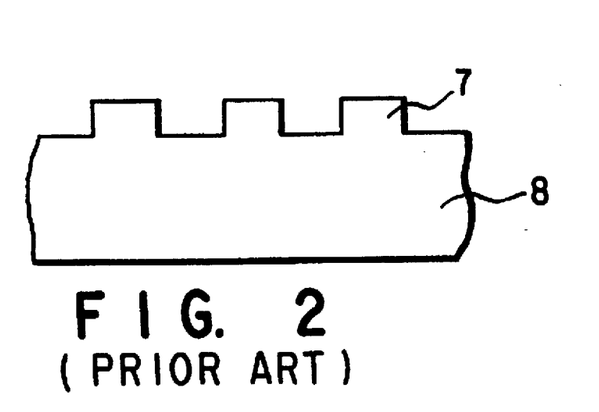
FIG. 2 is a cross-sectional view showing a normal alignment mark on a wafer.
Figure 3:
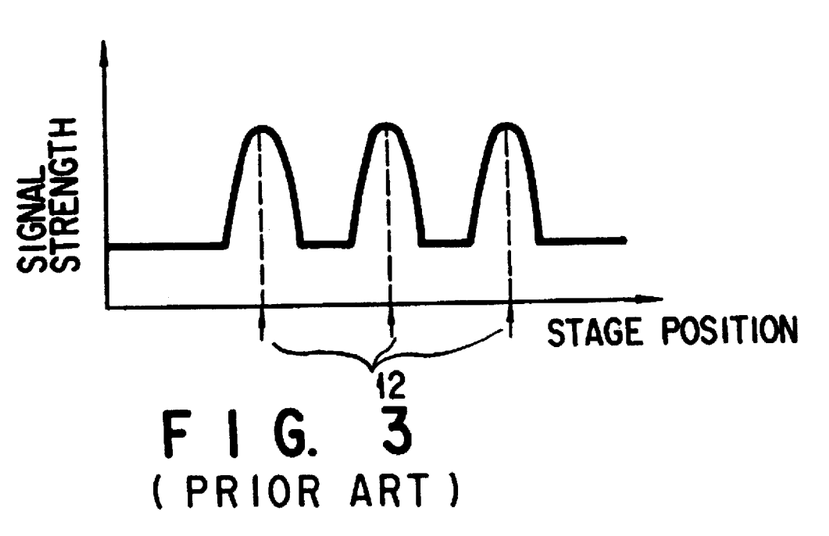
FIG. 3 is a signal waveform diagram showing an alignment signal in a state shown in FIG. 2.

The first conventional example is as shown in FIG. 1 and scanning is effected with a He—Ne laser beam (a probe beam) through oscillation of the beam. By so doing, those diffraction beams coming from the alignment mark 7 are detected, as signals, by virtue of an oscillation type electron microscope 1. In FIG. 1, reference numerals 2, 3, 4, 5, 6, 8 and (9, 10, 11) represent an ITV camera, a laser light source, an oscillation mirror, an ITV illumination light source, a stepper's lens, a wafer and mirrors, respectively. In the normal case, the wafer 8 and alignment mark 7 are as indicated in FIG. 2 and, at this time, a corresponding signal is as shown in FIG. 3. Those reference numerals 12 in FIG. 3 show alignment mark positions detected.

Figure 8:
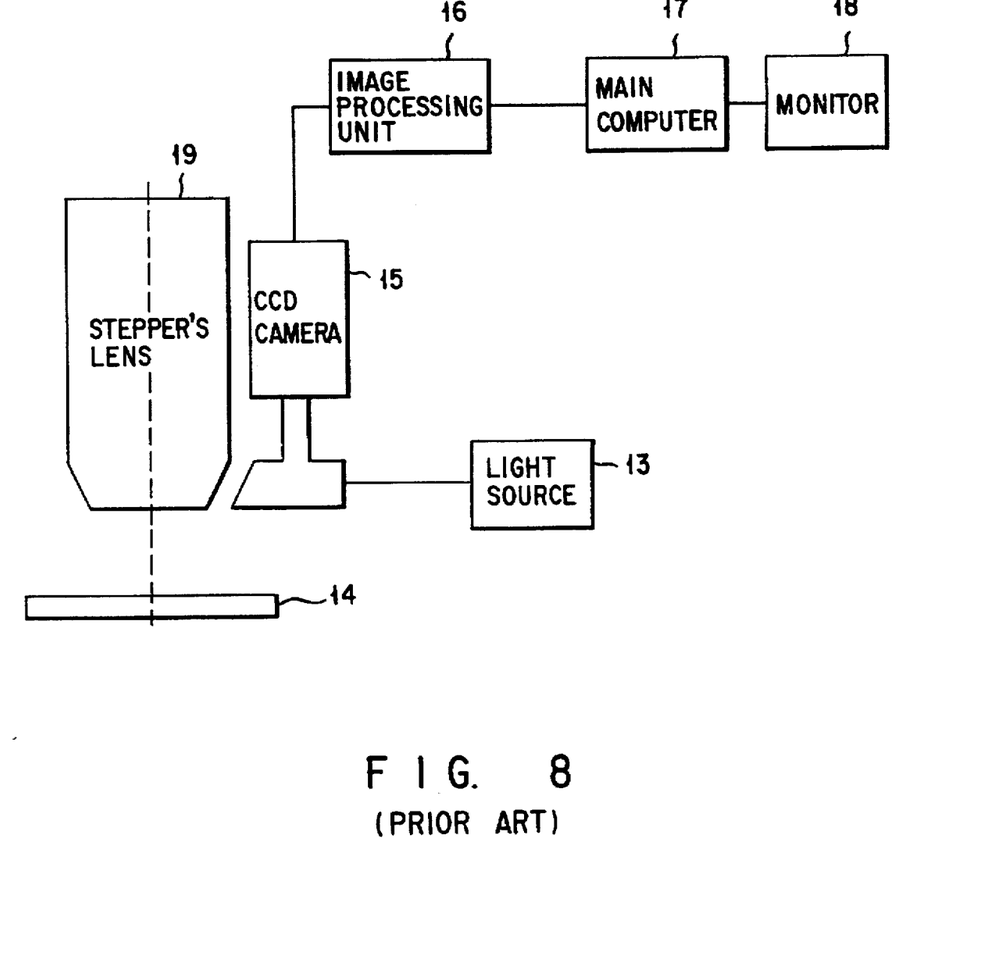
FIG. 8 is a diagrammatic view showing an optical system using an alignment method according to a second conventional example.

The second conventional example is as shown in FIG. 8 in which case use is made of an alignment method employing image processing. In this example, a white-color halogen lamp, etc., is used as the light source 13 and a necessary illumination beam coming from the light source 13 is sent to an optical system and directed at a wafer 14. A reflected beam coming from the wafer 14 is sent via the same optical system to a CCD camera 15 where a wafer image is converted to a video signal. The signal is transferred to an image processing unit 16 where computation necessary for alignment processing is carried out. A result of computation is processed at a main computer 17 so that the wafer exposure position is controlled. In FIG. 8, reference numerals 18 and 19 represent a monitor and a stepper's lens.

Figure 4:
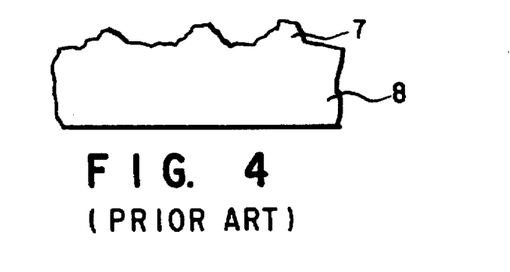
FIG. 4 is a cross-sectional view showing an alignment mark on a wafer having a rough surface.
Figure 5:
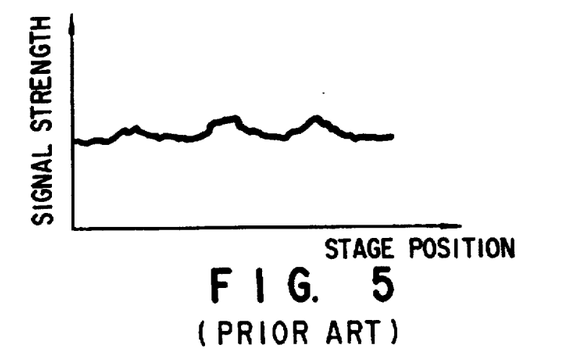
FIG. 5 is a signal waveform showing an alignment signal in a state shown in FIG. 4.
Figure 6:
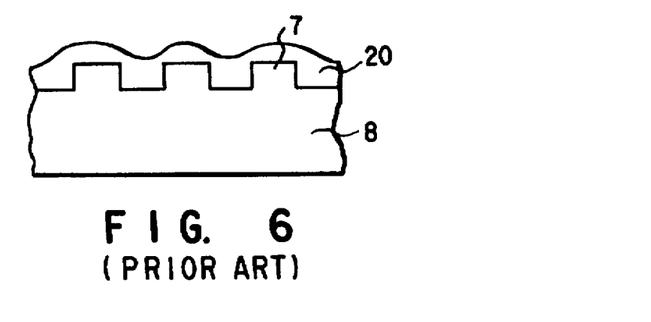
FIG. 6 is a cross-sectional view showing a low-stepped alignment mark resulting from a sputter.
Figure 7:
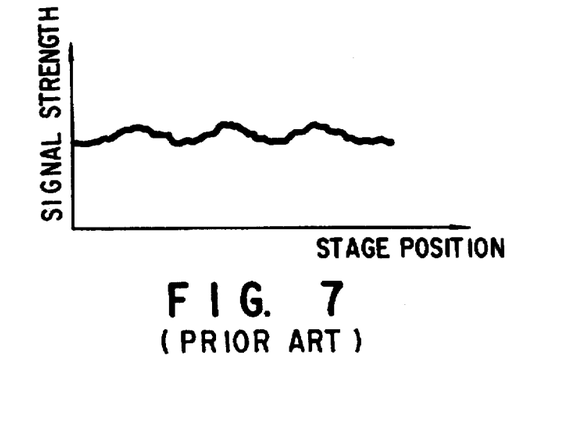
FIG. 7 is a signal waveform showing an alignment signal in a state shown in FIG. 6.

In the first conventional example, when the surface of the wafer 8 is roughened by a process as shown in FIG. 4, the alignment mark 7 is stepped low due to sputtering, etc., as shown in FIG. 6, and it becomes difficult to detect the alignment mark. In this connection it is to be noted that FIG. 5 shows an alignment signal for the case of FIG. 4 and FIG. 7 shows an alignment signal for the case of FIG. 6. In FIG. 6, reference numeral 20 shows a layer (sputter).

Figure 9:
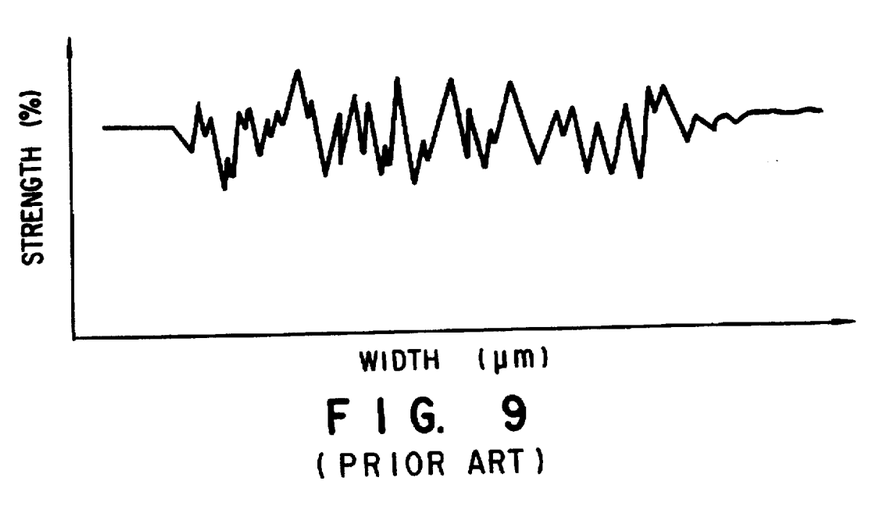
FIG. 9 is a signal waveform diagram showing an alignment signal as used in the alignment method shown in FIG. 8.

In the second conventional example, it is difficult to detect the edge of a harsh-surface (grains are present there) or a low-stepped alignment mark on the wafer. The alignment mark, being alignment-processed, produces an alignment signal as shown in FIG. 9. Noise, etc., is produced on a corresponding waveform due to an adverse effect caused by the grains, etc., on the surface. With the alignment mark low-stepped as set out above, the signal strength is lowered, thus making it difficult to secure alignment per se. Further, the lowering, etc., of the alignment accuracy is caused, thus producing inconvenience.

SUMMARY OF THE INVENTION

It is accordingly the object of the present invention to provide an alignment method for accurately detecting an alignment mark on a wafer having a rough surface or a low-stepped alignment mark resulting from a sputter, etc., and determining a mark position.

According to one aspect of the present invention, there is provided an alignment method for determining a mark position by using visible light as probe light and a position signal detecting sensor when alignment is to be made, through an exposure device, on a wafer at an alignment mark, comprising the steps of detecting not only a luminance signal but also spectral wavelength signals corresponding to colors by using any of a first method for determining a mark position with one of photodiodes for colors which shows a maximal contrast between a mark area and a non-mark area, a second method for determining a mark position by detecting mark positions with photodiodes for colors and taking an average for these positions and a third method for determining a mark position by determining a ratio for determining that mark position, through photodiodes for colors, by using different contrast levels between a mark area and a non-mark area and a CCD color area sensor as the sensor and determining a mark position by doing so.

According to another aspect of the present invention, there is provided an alignment method for controlling a wafer exposure position by directing alignment light coming from a source of light to a wafer, sending its reflected light to a CCD camera, transferring a corresponding wafer image as a video signal from the CCD camera to an image processing unit and making computation and processing a result by a main computer, comprising the step of arranging an angle-variable prism or a waveform select filter on an optical path for the alignment light to allow the alignment light to be subjected to an interference or polarization.

According to the present invention, it is possible to much more readily detect an alignment mark having a rough surface or a low-stepped mark resulting from a sputter, etc. than according to the conventional technique. Since the CCD color area sensor can detect a corresponding color signal, it is possible to determine delicate shades of colors between a mark area and a non-mark area and, further, the detection capability of the alignment mark is more improved than that obtained by the conventional technique and a technique using black-and-white area sensor.

According to another object of the present invention, since an angle-varying prism or a wavelength select filter is so located as to allow broad-band alignment light to be processed, that is, to be subjected to a noise reduction or a polarization, it is possible to obtain an image with which the alignment mark can be readily detected or to select any proper wavelength. Further an alignment mark image is more clearly seen than that obtained by the conventional technique and hence the edge of the alignment mark 36 is more evident.

DETAILED DESCRIPTION OF THE PREFERRED EMBODIMENTS

Referring to the Figures, two examples of the present invention will be explained below in more detail.

FIRST EXAMPLE

Figure 10:
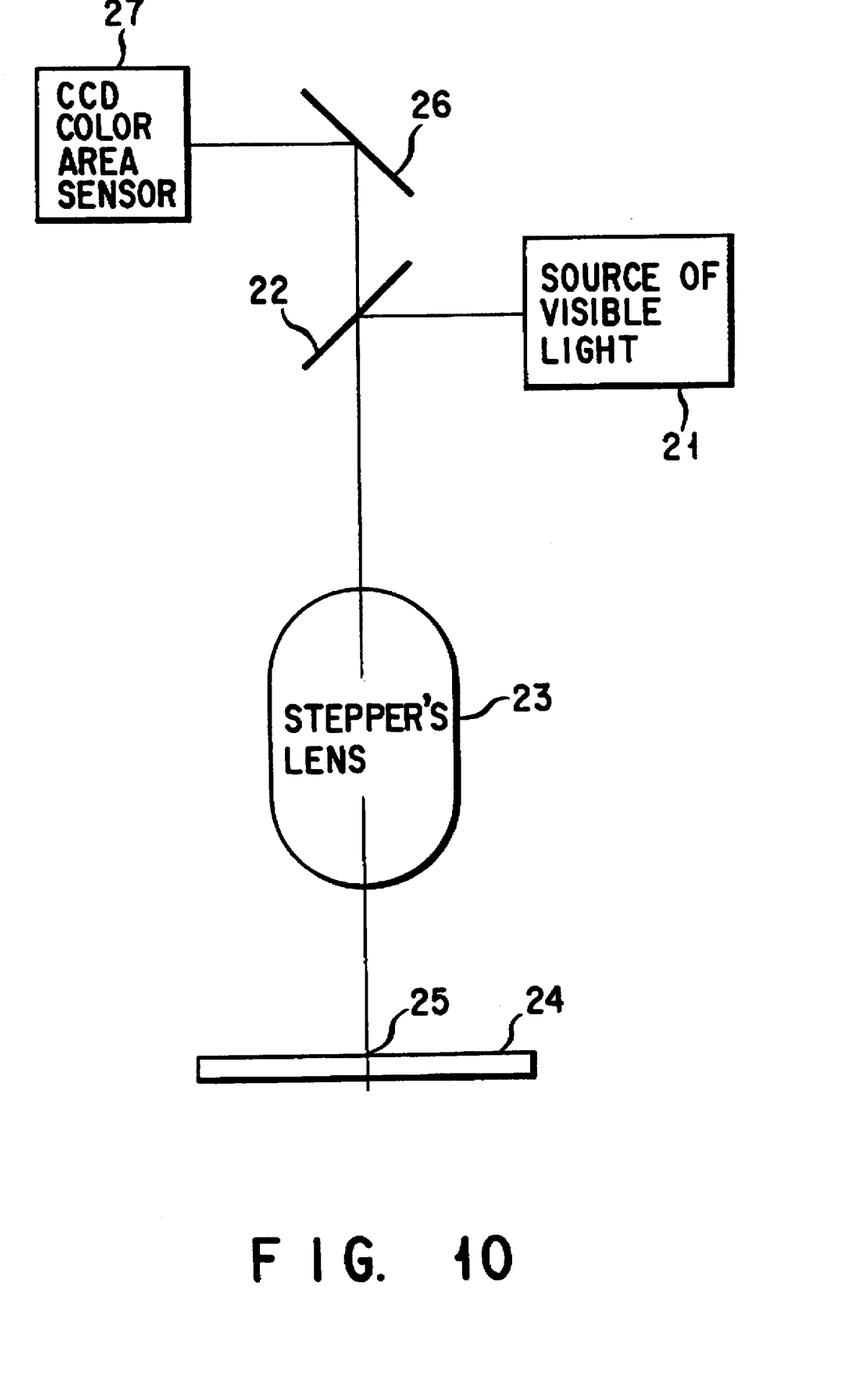
FIG. 10 is a diagrammatic view showing an optical system as used in an alignment method according to a first example of the present invention.

The alignment method of the first example of the present invention is shown in FIG. 10. Reference numeral 21 in FIG. 10 shows a source of visible light and a mirror 22 is provided on an optical path of the visible light source 21. A stepper (an object lens of a wafer alignment microscope) and wafer 24 are arranged at predetermined intervals relative to a mirror 22 on an optical path orthogonal to the above optical path. Reference numeral 25 in FIG. 10 shows an alignment mark. A mirror 26 is arranged on a side opposite to that on which the mirror 22 is arranged. Relative to the mirror 26 a CCD color area sensor 27 is arranged in a relation orthogonal to the optical path leading to the wafer 24.

Figure 11:
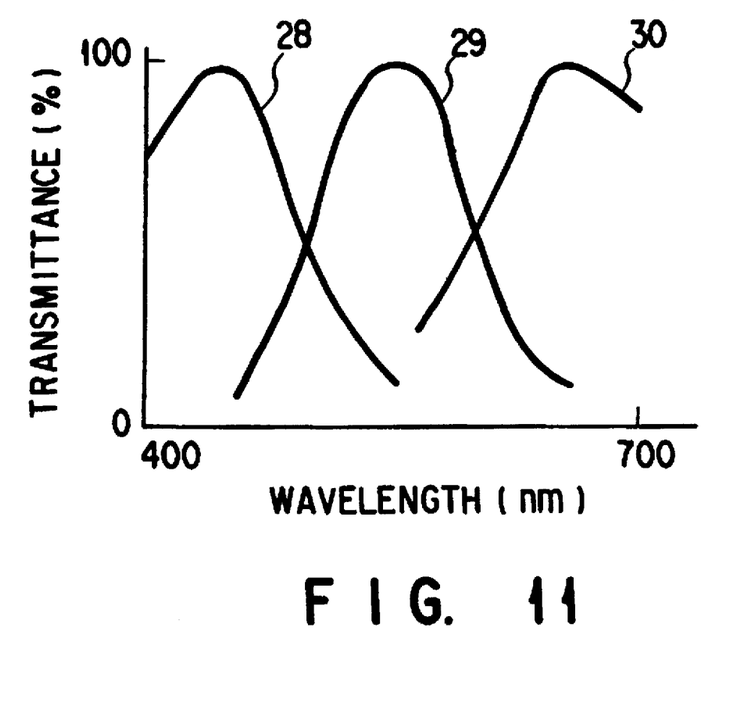
FIG. 11 is a characteristic curve showing red, green and blue spectral transmittances in the alignment method shown in FIG. 10.

At a time of operation, visible light of 400 to 700 nm emitted from the source 21 is reflected by the mirror 22, illuminates the wafer at an alignment mark through the lens 23 and is directed past the lens 23 and mirror 22 to the mirror 26 where it is reflected. The reflected light is conducted to the CCD color area sensor 27 where it is imaged. This is followed by the image processing and the determination of that mark position. The colors of the CCD color area sensor 27 are red, green and blue or cyan, yellow and magenta. FIG. 11 shows the spectral transmittances of red, green and blue, noting that reference numerals 28, 29 and 30 in FIG. 11 represent blue, green and red.

According to the present invention, upon determination of the above mark position, any of the following three methods and a CCD color area sensor 27 are employed to detect not only a luminance signal but also the spectral wavelength signal of each color and to determine the mark position.

Figure 12:
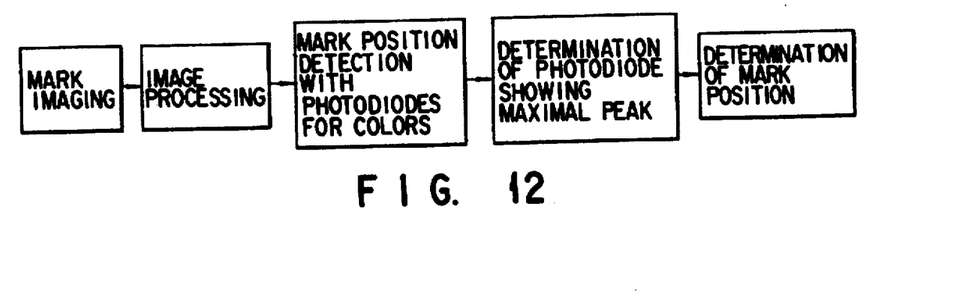
FIG. 12 is a block diagram showing a processing system as used in a first mark position determining method as in the alignment method shown in FIG. 10.
Figure 13A:
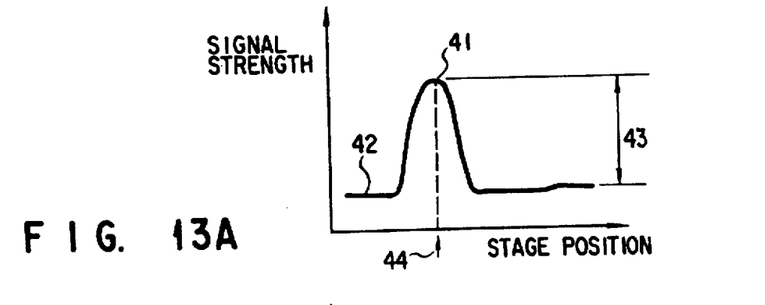
FIG. 13A is a signal waveform diagram showing the signal strength for photodiode for red and mark position in the case of FIG. 12.
Figure 13B:
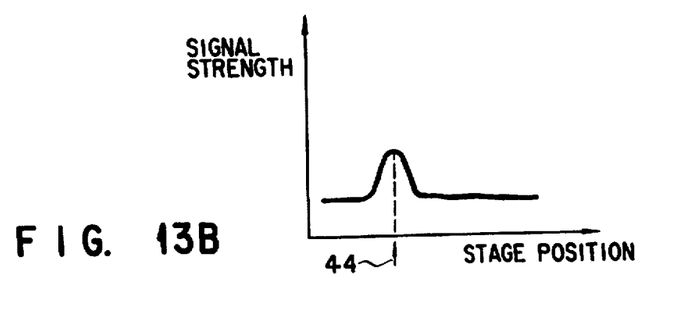
FIG. 13B is a signal waveform diagram showing the signal strength for photodiode for green and mark position in the case of FIG. 12.
Figure 13C:
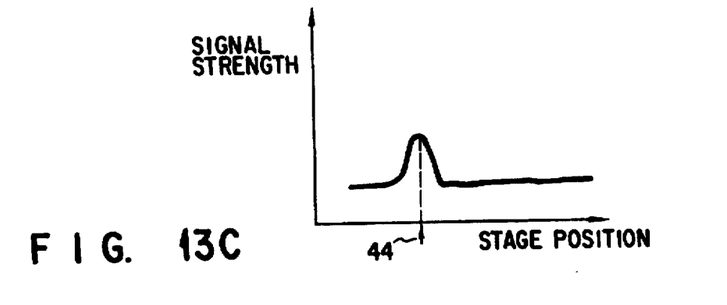
FIG. 13C is a signal waveform diagram showing the signal strength for photodiode for blue and mark position in the case of FIG. 12.

The first method is by determining, using those photodiodes of the respective colors, a mark position for that photodiode of a color representing a maximal contrast (an amount of electrons flowing through the photodiode) between the mark area and the non-mark area. FIG. 12 shows its processing system. In this case, the mark positions detected with the photodiodes of the respective colors are as shown in FIGS. 13A, 13B and 13C representing red, green and blue, respectively. In FIG. 13A, reference numerals 41, 42 and 43 show a top, a bottom and a contrast, respectively, in signal strength with a reference numeral 44 in each Figure representing an alignment mark detected. Since, in the first method, the mark position is determined with the photodiode for the color representing a maximal contrast, the mark position finally determined corresponds to the position where red is represented.

Figure 14:
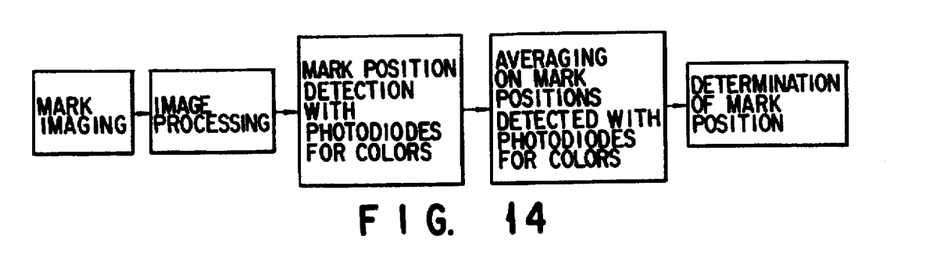
FIG. 14 is a block diagram showing a processing system using a second mark position determining method as in the alignment method shown in FIG. 10.
Figure 15A:
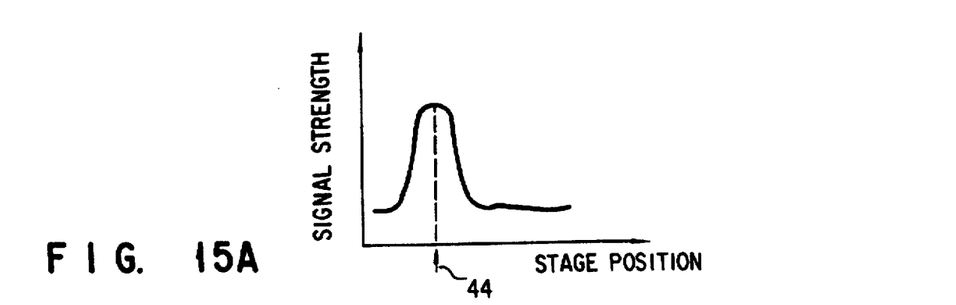
FIG. 15A is a signal waveform diagram showing the signal strength of photodiode for red and mark position in the case of FIG. 14.
Figure 15B:
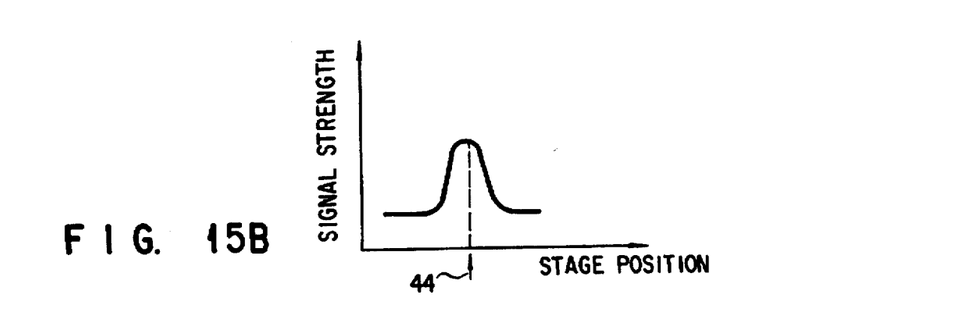
FIG. 15B is a signal waveform diagram showing the signal strength for photodiode for green and mark position in the case of FIG. 14.
Figure 15C:
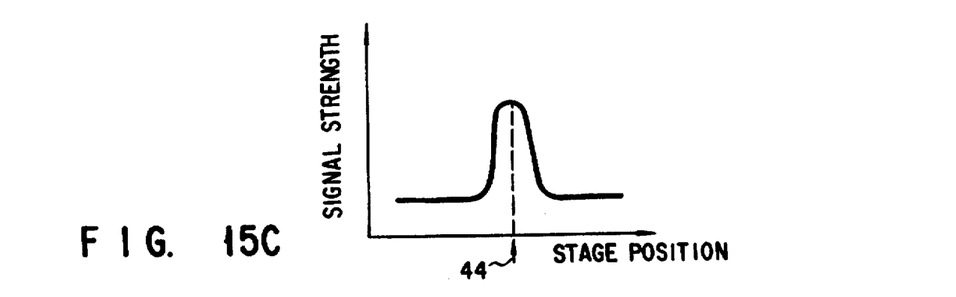
FIG. 15C is a signal waveform diagram showing the signal strength for photodiode for blue and mark position in the case of FIG. 14.

The second method is by detecting mark positions with respective photodiodes for respective colors and determining a mark position with an average taken for these detected positions. FIG. 14 shows its processing system. In this case, the mark positions detected with the respective photodiodes of the respective colors are as shown in FIGS. 15A, B and C representing red, green and blue, respectively. In the second method, irrespective of the contrast levels, the mark position is found on the average and, if the red, green and blue positions are given 2, 3 and 4, respectively, then the average position becomes 3 and hence the mark position determined becomes equal to the position representing "green".

Figure 16:
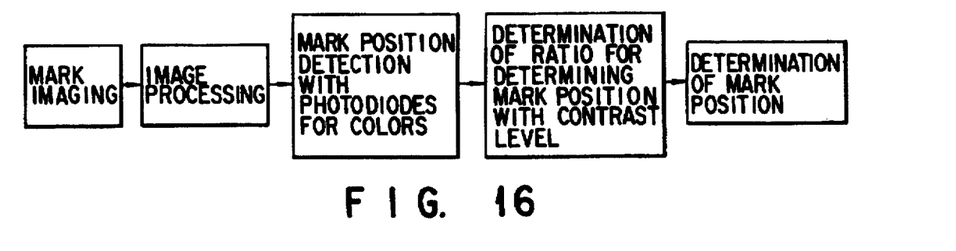
FIG. 16 is a block diagram showing a processing system using a third mark position determining method as in the alignment method shown in FIG. 10.
Figure 17A:
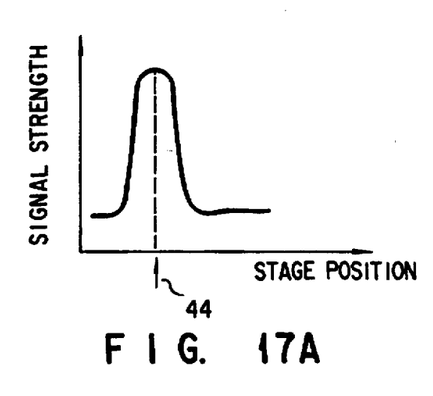
FIG. 17A is a signal waveform diagram showing the signal strength of photodiode for red and mark position in the case of FIG. 16.
Figure 17B:
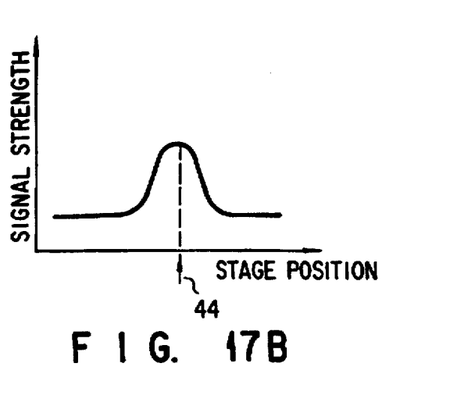
FIG. 17B is a signal waveform diagram showing the signal strength for photodiode for green and mark position in the case of FIG. 16.
Figure 17C:
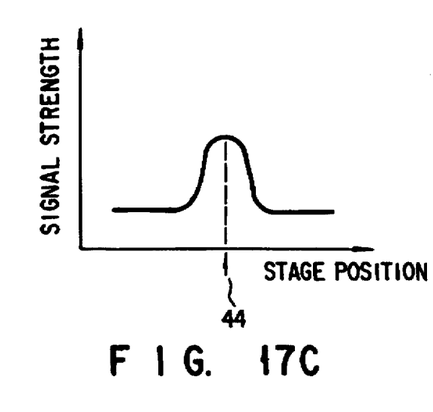
FIG. 17C is a signal waveform diagram showing the signal strength for photodiode for blue and mark position in the case of FIG. 16.
Figure 17D:
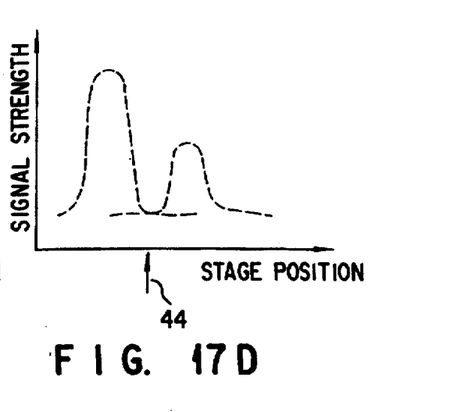
FIG. 17D is a signal waveform diagram showing the signal strengths for photodiodes for red, green, and blue and mark positions determined by the processing of a processing system in the case of FIG. 16.

The third method is by determining a ratio for determining a mark position at different contrast levels on the mark and non-mark areas with respective photodiodes of respective colors and determining a given mark position. FIG. 16 shows its processing system. In this case, the mark positions detected with those photodiodes of the respective colors are as shown in FIGS. 17A, B and C representing red, green and blue, respectively, with FIG. 17D denoting a mark position determined by the processing system.

According to the third method, the ratio of determining the mark position varies with the contrast levels and, if the red signal strength and mark position are 4 and 2, green signal strength and mark position 2 and 4, and blue signal strength 2 and marks position 4, respectively, since the red signal strength is two times as great as the green and blue ones, the ratio of determining the mark position is two times as great as the remaining two kinds. There, the mark position determined becomes 3.

The third method is based on the fact that the photodiode of a great contrast color, being compared with that of a small contrast color, becomes greater in the weight with which the mark position is determined.

SECOND EXAMPLE

Figure 18:
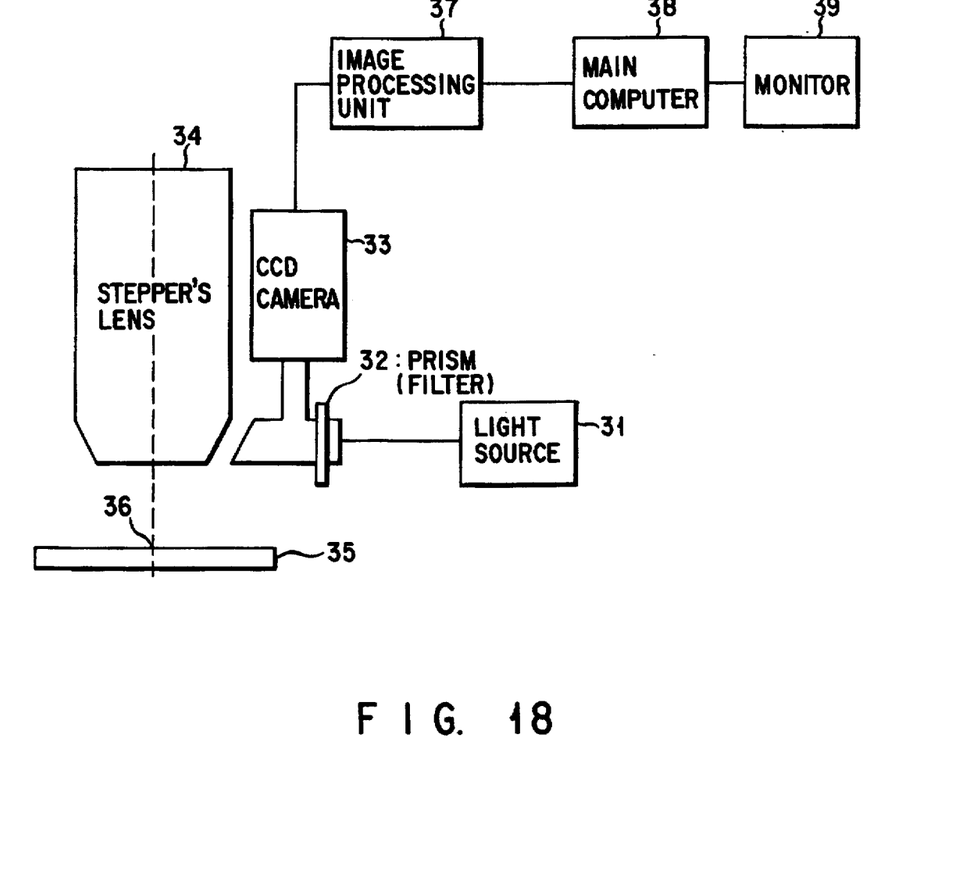
FIG. 18 is a diagrammatic diagram showing an optical system used in an alignment method according to a second example of the present invention.

The alignment method according to the second example of the present invention is as shown in FIG. 18. In the arrangement of FIG. 18, reference numeral 31 shows a light source, such as a white-color halogen lamp, and an angular-variable prism or a wavelength select filter 32, CCD camera 33 and projection reduction lens (stepper) 34 are arranged at predetermined intervals on an optical path through which alignment light coming from the optical source 31 passes, the angle-variable prism or filter 32 allowing alignment light of a broader band to be processed, that is, being subjected to a noise reduction or a polarization. A wafer 35 is located in a direction perpendicular to the optical path so as to correspond to the lens 34. Reference numeral 36 in FIG. 18 shows an alignment mark. An image processing unit 37, main computer 38 and monitor 39 are sequentially connected to the CCD camera 33.

In operation, light of a wavelength necessary for illumination is sent from the light source 31 to the optical system and, upon illumination on the wafer 35, the prism or filter 32 as set out above is located on the optical path of the alignment light, that is, near the CCD camera 33. The light reflected from the wafer 35 is sent to the CCD camera 33 past the same optical system. At the CCD camera 33, a corresponding wafer image is transferred as a video signal, computation necessary for alignment processing is made and a result of computation is processed by the main computer 38 so that control is made on the wafer exposure position.

Figure 19:
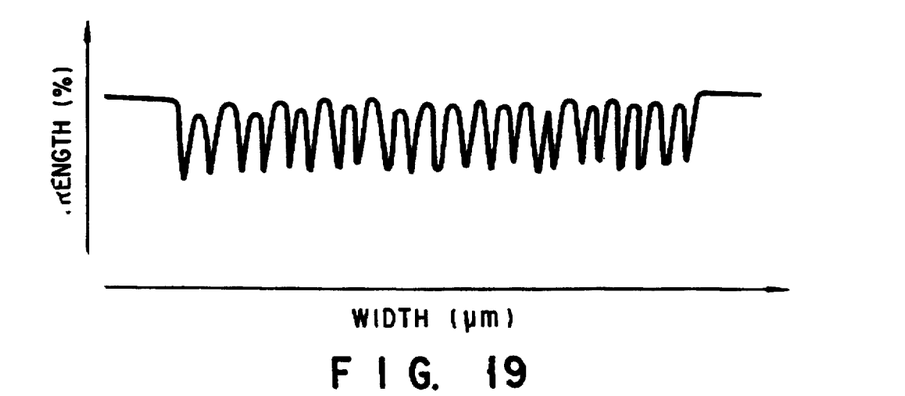
FIG. 19 is a signal waveform diagram showing an alignment signal as in the second example shown in FIG. 18.

In this case, an alignment signal as shown in FIG. 19 is obtained through alignment by the image processing.

According to the second example there is an advantage in that it is possible to select an image or an arbitrary wavelength with or at which the alignment mark 36 can be readily detected. That is, the alignment mark image is more clearly seen than that obtained by the conventional technique and the edge of the alignment mark 36 becomes more clarified. Upon examination on the alignment signal corresponding to the alignment mark image, it is possible to obtain a better alignment signal waveform and luminance as will be seen from the waveform in FIG. 19. It is also possible to obtain an alignment of the wafer which it has been difficult to do and to obtain accurate alignment and hence to achieve a very effective alignment method.

As set out above, according to the present invention, since use is made of any of the first to third methods and CCD color area sensor 27 of the present invention and since the alignment mark 25 is detected with the luminance signal, an alignment mark on a wafer having a rough surface or a low-stepped alignment mark resulting from the sputter, etc., is more readily detectable than according to the conventional technique. Further, since the CCD color area sensor 27 can detect the color signal, it is possible to determine delicate shades of colors between the mark area and the non-mark area. Therefore, the detection capability of the alignment mark 25 is greatly improved compared with that obtained by the conventional technique and CCD black-and-white area sensor.

In the second example of the present invention, since the angle variable prism is arranged on the optical path for the alignment light to allow the alignment light to be processed, that is, to be subjected to a noise reduction or polarization, it is possible to obtain an image with which the alignment mark 36 is readily detectable or to selectively employ any proper wavelength length. The alignment mark image is more prominently seen than that obtained by the conventional technique and hence the edge of the alignment mark 36 are more prominent.

What is claimed is:

1. An alignment method for controlling an exposure position of a wafer comprising the steps of:

generating light having multiple wavelengths;

directing the light to the wafer through a filter;

directing a plurality of wavelengths of reflected light from the wafer to a CCD camera;

generating a wafer image by the CCD camera, the wafer image being composed of three colors;

transferring the wafer image as a video signal from the CCD camera to an image processing unit, the video signal being composed of three colors;

processing the wafer image from the image processing unit the video signal by a computer to establish the location of an alignment mark on the wafer utilizing a contrast between a portion of the wafer with the alignment mark and a portion of the wafer without the alignment mark; and adjusting the position of the wafer to place the alignment mark in a predetermined position.

2. The method of claim 1, wherein the processing step comprises the steps of:

establishing an intensity signal for each of the three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

comparing the first and second portions of each intensity signal to establish a contrast signal for each of the three colors from the plurality of wavelengths of reflected light;

establishing a maximum contrast signal by selecting from the three colors the contrast signal with the greatest magnitude; and equating the position of the alignment mark with the position signal of the maximum contrast signal.

3. The method of claim 1, wherein the processing step comprises the steps of:

establishing an intensity signal for each of the three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

averaging the position signals for each intensity signal together to establish an average position signal; and equating the position of the alignment mark with the average position signal.

4. The method of claim 1, wherein the processing step comprises the steps of:

establishing an intensity signal for each of the three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

comparing the first and second portions of each intensity signal to establish a contrast signal for each of the three colors from the plurality of wavelengths of reflected light;

establishing a weighted average of the position signals through a ratio between the position signal and contrast signal for each of the three colors from the plurality of wavelengths of reflected light; and equating the position of the alignment mark with the weighted average of the position signals.

5. A method for determining a position of an alignment mark on a wafer comprising the steps of:

generating light having multiple wavelengths;

illuminating the wafer with light;

detecting a plurality of wavelengths of reflected light from the wafer;

establishing an intensity signal for each of three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

comparing the first and second portions of each intensity signal to establish a contrast signal for each of the three colors from the plurality of wavelengths of reflected light;

establishing a maximum contrast signal by selecting from the three colors the contrast signal with the greatest magnitude; and equating the position of the alignment mark with the position signal of the maximum contrast signal.

6. A method for determining a position of an alignment mark on a wafer comprising the steps of:

generating light having multiple wavelengths;

illuminating the wafer with the light;

detecting a plurality of wavelengths of reflected light from the wafer;

establishing an intensity signal for each of three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal; and averaging the position signals to establish an average position signal; and equating the position of the alignment mark with the average position signal.

7. A method for determining a position of an alignment mark on a wafer comprising the steps of:

generating light having multiple wavelengths;

illuminating the wafer with the light;

detecting a plurality of wavelengths of reflected light from the wafer;

establishing an intensity signal for each of three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

comparing the first and second portions of each intensity signal to establish a contrast signal for each of the three colors from the plurality of wavelengths of reflected light;

establishing a weighted average of the position signals through a ratio between the position signal and contrast signal for each of the three colors from the plurality of wavelengths of reflected light; and equating the position of the alignment mark with the weighted average of the position signals.

8. An alignment method for controlling an exposure position of a wafer comprising the steps of:

generating light having multiple wavelengths;

directing the light to the wafer through an angle-variable prism, the angle-variable prism polarizing the light;

directing a plurality of wavelengths of reflected light from the wafer to a CCD camera;

generating a wafer image by the CCD camera, the wafer image being composed of three colors;

transferring the wafer image as a video signal from the CCD camera to an image processing unit, the video signal being composed of three colors;

processing the video image by a computer to establish the location of an alignment mark on the wafer utilizing the polarization to establish a contrast between a portion of the wafer with the alignment mark and portion of the wafer without the alignment mark; and adjusting the position of the wafer to place the alignment mark in a predetermined position.

9. The method of claim 8 wherein the processing step comprises the steps of:

establishing an intensity signal for each of three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

comparing the first and second portions of each intensity signal to establish a contrast signal for each of the three colors from the plurality of wavelengths of reflected light;

establishing a maximum contrast signal by selecting from three colors the contrast signal with the greatest magnitude; and equating the position of the alignment mark with the position signal of the maximum contrast signal.

10. The method of claim 8, wherein the processing step comprises the steps of:

establishing an intensity signal for each of the three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

averaging the position signals for each intensity signal together to establish an average position signal; and equating the position of the alignment mark with the average position signal.

11. The method of claim 8, wherein the processing step comprises the steps of:

establishing an intensity signal for each of the three colors from the plurality of wavelengths of reflected light, each intensity signal including a first portion corresponding to the reflected light from a portion of the wafer with the alignment mark and a second portion corresponding to the reflected light from a portion of the wafer without the alignment mark;

associating a position signal with each intensity signal corresponding to the first portion of each intensity signal;

comparing the first and second portions of each intensity signal to establish a contrast signal for each of the three colors from the plurality of wavelengths of reflected light;

establishing a weighted average of the position signals through a ratio between the position signal and contrast signal for each of the three colors from the plurality of wavelengths of reflected light; and equating the position of the alignment mark with the weighted average of the position signals.

12. An alignment apparatus for controlling an exposure position of a wafer, comprising:

a light source that generates visible light with a plurality of wavelengths;

a filter that removes some wavelengths of light from the visible light;

means for directing the visible light from the light source, through the filter, to the wafer;

a CCD camera;

means for directing light reflected from the wafer to the CCD camera, wherein the CCD camera generates an electronic wafer image from the light reflected from the wafer, the electronic wafer image being composed of three colors;

a processing unit;

means for transferring the electronic wafer image to the processing unit, wherein the processing unit establishes a location of an alignment mark; and means for adjusting the position of the wafer to position the alignment mark in a predetermined position.

13. The apparatus of claim 12, wherein the processing unit comprises:

means for establishing an intensity signal for each of the three colors, each intensity signal including a first portion corresponding to light reflected from a portion of the wafer with the alignment mark and a second portion corresponding to light reflected from a portion of the wafer without the alignment mark;

means for associating a position signal with each intensity signal corresponding to the first portion of each intensity signal;

means for comparing the first and second portions of each intensity signal to establish a contrast signal for each of the three colors;

means for establishing a maximum contrast signal by selecting from the three colors the contrast signal with the greatest magnitude; and means for equating the position of the alignment mark with the position signal of the maximum contrast signal.

14. The apparatus of claims 12, wherein the processing unit comprises:

means for establishing an intensity signal for each of the three colors, each intensity signal including a first portion corresponding to light reflected from a portion of the wafer with the alignment mark and a second portion corresponding to light reflected from a portion of the wafer without the alignment mark;

means for associating a position signal with each intensity signal corresponding to the first portion of each intensity signal;

means for averaging the position signals for each intensity signal together to establish an average position signal; and means for equating the position of the alignment mark with the average position signal.

15. The apparatus of claim 12, wherein the processing unit comprises:

means for establishing an intensity signal for each of the three colors, each intensity signal including a first portion corresponding to light reflected from a portion of the wafer with the alignment mark and a second portion corresponding to light reflected from a portion of the wafer without the alignment mark;

means for associating a position signal with each intensity signal corresponding to the first portion of each intensity signal;

means for comparing the first and second portions of each intensity signal to establish a contrast signal for each of the three colors;

means for establishing a weighted average of the position signals through a ratio between the position signal and contrast signal for each of the three colors; and means for equating the position of the alignment mark with the weighted average of the position signals.

16. An alignment apparatus for controlling are exposure position of a wafer, comprising:

a light source that generates visible light with multiple wavelengths;

an angle-variable prism that polarizes the visible light;

means for directing the visible light from the light source, through the angle-variable prism, to the wafer;

a CCD camera;

means for directing light reflected from the wafer to the CCD camera, wherein the CCD camera generates an electronic wafer image from the light reflected from the wafer, the electronic wafer image being composed of three colors;

a processing unit;

means for transferring the electronic wafer image to the processing unit, wherein the processing unit establishes a location of an alignment mark; and means for adjusting the position of the wafer to position the alignment mark in a predetermined position.

17. The apparatus of claim 16, wherein the processing unit comprises:

means for establishing an intensity signal for each of the three colors, each intensity signal including a first portion corresponding to light reflected from a portion of the wafer with the alignment mark and a second portion corresponding to light reflected from a portion of the wafer without the alignment mark;

means for associating a position signal with each intensity signal corresponding to the first portion of each intensity signal;

means for comparing the first and second portions of each intensity signal to establish a contrast signal for each of the three colors;

means for establishing a maximum contrast signal by selecting from the three colors the contrast signal with the greatest magnitude; and means for equating the position of the alignment mark with the position signal of the maximum contrast signal.

18. The apparatus of claims 16, wherein the processing unit comprises:

means for establishing an intensity signal for each of the three colors, each intensity signal including a first portion corresponding to light reflected from a portion of the wafer with the alignment mark and a second portion corresponding to light reflected from a portion of the wafer without the alignment mark;

means for associating a position signal with each intensity signal corresponding to the first portion of each intensity signal;

means for averaging the position signals for each intensity signal together to establish an average position signal; and means for equating the position of the alignment mark with the average position signal.

19. The apparatus of claim 16, wherein the processing unit comprises:

means for establishing an intensity signal for each of the three colors, each intensity signal including a first portion corresponding to light reflected from a portion of the wafer with the alignment mark and a second portion corresponding to light reflected from a portion of the wafer without the alignment mark;

means for associating a position signal with each intensity signal corresponding to the first portion of each intensity signal;

means for comparing the first and second portions of each intensity signal to establish a contrast signal for each of the three colors;

means for establishing a weighted average of the position signals through a ratio between the position signal and contrast signal for each of the three colors; and means for equating the position of the alignment mark with the weighted average of the position signals.

* * * * *